United States Patent [19]
Kojima

[11] Patent Number: 5,208,815
[45] Date of Patent: May 4, 1993

[54] APPARATUS FOR DECODING BCH CODE
[75] Inventor: Yuichi Kojima, Kanagawa, Japan
[73] Assignee: Sony Corporation, Tokyo, Japan
[21] Appl. No.: 426,862
[22] Filed: Oct. 26, 1989
[30] Foreign Application Priority Data
Nov. 4, 1988 [JP] Japan .................................. 63-278722
[51] Int. Cl.[5] ................................................ G06F 11/10
[52] U.S. Cl. .................................. 371/37.7; 371/37.1; 371/41
[58] Field of Search ........................ 371/41, 37.1, 37.7

[56] References Cited
U.S. PATENT DOCUMENTS

| 3,078,443 | 2/1963 | Rose | 371/41 |
|---|---|---|---|
| 3,372,376 | 3/1968 | Helm | 371/41 |
| 3,411,135 | 11/1968 | Watts | 371/37.1 |
| 3,418,629 | 12/1968 | Chien | 371/37.1 |
| 3,623,155 | 11/1971 | Hsiao et al. | 371/37.1 |
| 3,896,416 | 7/1975 | Barrett et al. | 371/41 |
| 4,107,652 | 8/1978 | Tanahashi et al. | 371/37.1 |
| 4,397,022 | 8/1983 | Weng et al. | 371/41 |
| 4,694,455 | 9/1987 | Koga | 371/37.1 |
| 4,723,245 | 2/1988 | Leslie | 371/37.1 |
| 4,739,504 | 4/1988 | Leslie | 371/37.1 |
| 4,739,506 | 4/1988 | Leslie | 371/37.1 |
| 4,751,704 | 6/1988 | Kojima | 371/37.2 |
| 4,771,429 | 9/1988 | Davis et al. | 371/37.1 |
| 4,833,678 | 5/1989 | Cohen | 371/37.1 |
| 4,890,286 | 12/1989 | Hirose | 371/37.1 |

OTHER PUBLICATIONS
Peterson et al., Error Correcting Codes, 1972, Appendix D.

Primary Examiner—Robert W. Beausoliel, Jr.
Assistant Examiner—Allen M. Lo
Attorney, Agent, or Firm—Hill, Steadman & Simpson

[57] ABSTRACT

An apparatus for decoding BCH code having first, second and third circuits for generating a syndrome S1, a syndrome S3 and a parity P, respectively from a receiving sequence, a fourth circuit coupled to the first circuit for generating $S1^2$ from the syndrome S1, a fifth circuit coupled to the first circuit, second circuit and fourth circuit for generating $(S1^3+S3)$, a Chien search circuit which includes a first generating circuit supplied with the S1 and $S1^2$ for generating a first stage of error-location polynomial A, where $A=S1\alpha^{-2n}+S1^2\alpha^{-n}$, and a second generating circuit supplied with the $(S1^3\alpha+S3)$ and the A for generating a second stage of error-location polynomial B, wherein $B=A+S1^3+S3$, and an error correction and detection logic circuit supplied with the S1, P, $(S1^3+S3)$, A and B and with a decode selection signal and a BCH code selection signal for generating an error correction or detection signal.

5 Claims, 3 Drawing Sheets

APPARATUS FOR DECODING BCH CODE

BACKGROUND OF THE INVENTION

1. Field of the Invention

The present invention relates to an apparatus for decoding BCH code suitable for use in a wide variety of data communications.

2. Description of the Prior Art

The assignee of the present application has previously proposed an apparatus for decoding BCH (Bose-Chaud-huriHocquenghem) code suitable for being formed as a large scale integrated (LSI) circuit (see Japanese Laid-open Patent Gazette No. 61-281720, and corresponding U.S. Pat. No. 4,751,704). This previously-proposed BCH code decoding apparatus is constructed as shown in FIG. 1.

In FIG. 1, a received sequence is applied to an input terminal 1. The received sequence is supplied to an S1 forming circuit 2 and an S3 forming circuit 3 and the syndromes S1 and S3 are formed. The syndromes S1 and S3 are supplied to a zero detecting circuit 4. The zero detecting circuit 4 generates a detection signal of a low level "L" when all of the digits of the syndromes S1 and S3 are "O", namely, when no error is detected. This detection signal is supplied into a latch circuit 4A synchronously with the receiving sequence.

The syndrome S1 is supplied to an $S1^2$ forming circuit 5 and an $S1^3$ forming circuit 6 and the values of $S1^2$ and $S1^3$ are produced. The $S1^3$ forming circuit 6 multiplies $S1^2$ with S1 to produce $S1^3$ as will be explained hereinafter. The syndromes S3 and $S1^3$ are supplied to an arithmetic operating circuit 7, by which $(S1^3+S3)$ is formed.

In this manner, the respective coefficients S1, $S1^2$ $s1^3$ and S3 of the error-location polynomial $\sigma'(X)$ are obtained and supplied to a Chien search circuit 8 for performing the process of Chien search. The Chien search circuit 8 is shown as the region surrounded by the broken line in FIG. 1 and comprises: arithmetic operating circuits 9 and 12; delay circuits 10 and 13, each having the delay time of one clock pulse; switching circuits 11 and 14; an adding circuit 15; and a zero detecting circuit 16. The switching circuits 11 and 14 respectively select the syndromes S1 from the S1 forming circuit 2 and $S1^2$ from the $S1^2$ forming circuit 5 at the timing of the head bit of the receiving sequence. The switching circuits 11 and 14 respectively select outputs of the delay circuits 10 and 13 with respect to the remaining bits. Control of the switching circuits 11 and 14 is accomplished by a conventional circuit for generating timing control signals, operating in synchronism with the receiving sequence.

Outputs of the switching circuits 11 and 14 are supplied to the arithmetic operating circuits 9 and 12, respectively. Outputs of the operating circuits 9 and 12 are supplied to the delay circuits 10 and 13, respectively. In this way, the cyclic constitution is obtained. The operating circuit 9 multiplies $\alpha^{-2}$ and the operating circuit 12 multiplies $\alpha^{-1}$. $\alpha$ is the root of the generator polynomial over $GF(2^n)$. Assuming that a code length is n, the term of $S1\alpha^{-2n}$ is obtained by the operating circuit 9 and the term of $S1^2\alpha^{-n}$ is derived by the operating circuit 12. The outputs of the operating circuits 9 and 12 are supplied to the adding circuit 15 to perform the addition of 30 (mod. 2).

The adding circuit 15 executes the arithmetic operation of the error-location polynomial $(\sigma'(X)=S1x^2+S1^2x+S1^3+S3)$. An output of the adding circuit 15 is supplied to the zero detecting circuit 16. The position where the output of the adding circuit 15 becomes zero is the error location. The zero detecting circuit 16 generates a correction instructing signal which becomes a high level "H" at the error location.

The correction instructing signal from the zero detecting circuit 16 is supplied to an AND gate 17 together with an output of the latch circuit 4A. The output of the latch circuit 4A becomes a low level "L", due to the zero detecting circuit 4, when all digits of both of the syndromes S1 and S3 are "0". When (S1=S3=0), the result of the operation of the error-location polynomial 15 becomes zero, so that the correction instructing signal which signals an error is generated from the zero detecting circuit 16. The AND gate 17 is provided to inhibit an improper correction instructing signal.

The correction instructing signal of "H" from the AND gate 17 is supplied to an exclusive OR gate (hereinafter referred to as EX-OR gate) 18. The bits of the receiving sequence from a shift register 19 are inverted by the EX-OR gate 18 in response to the correction instructing signal which is generated in correspondence to the error location, so that the bit errors are corrected. The error-corrected data sequence from the EX-OR gate 18 is taken out to an output terminal 20. The shift register 19 delays the receiving sequence by the period of time necessary for detection of the error location.

The invention can be applied to decode, for example, the (15, 7) BCH code, which (15) denotes the code length and (7) is the information bit length and the minimum distance is 5. Therefore, the errors of two bits or less can be corrected. The generator polynomial of this code is $$G(x) = (x^4 + x + 1)(x^4 + x^3 + x^2 + x + 1)$$
$$= x^8 + x^7 + x^6 + x^4 + 1$$

Assuming that $\alpha$ is the root of $(x^4+x+1=0)$, the minimal polynomial having as the root is $(x^4+x^3+x^2+x+1)$. The elements over the Galois Field $GF(2^4)$ which is given by $(x^4x+1)=0$ are as follows.

|  | $\alpha^3$ | $\alpha^2$ | $\alpha^1$ | $\alpha^0$ |
|---|---|---|---|---|
| 0 | 0 | 0 | 0 | 0 |
| $\alpha^0$ | 0 | 0 | 0 | 1 |
| $\alpha^1$ | 0 | 0 | 1 | 0 |
| $\alpha^2$ | 0 | 1 | 0 | 0 |
| $\alpha^3$ | 1 | 0 | 0 | 0 |
| $\alpha^4$ | 0 | 0 | 1 | 1 |
| $\alpha^5$ | 0 | 1 | 1 | 0 |
| $\alpha^6$ | 1 | 1 | 0 | 0 |
| $\alpha^7$ | 1 | 0 | 1 | 1 |
| $\alpha^8$ | 0 | 1 | 0 | 1 |
| $\alpha^9$ | 1 | 0 | 1 | 0 |
| $\alpha^{10}$ | 0 | 1 | 1 | 1 |
| $\alpha^{11}$ | 1 | 1 | 1 | 0 |
| $\alpha^{12}$ | 1 | 1 | 1 | 1 |
| $\alpha^{13}$ | 1 | 1 | 0 | 1 |
| $\alpha^{14}$ | 1 | 0 | 0 | 1 |

The parity-check matrix H of this code is shown below.

-continued $$H = \begin{bmatrix} \alpha^0\alpha^1\alpha^2\alpha^3\alpha^4\alpha^5\alpha^6\alpha^7\alpha^8\alpha^9\alpha^{10}\alpha^{11}\alpha^{12}\alpha^{13}\alpha^{14} \\ \alpha^0\alpha^3\alpha^6\alpha^9\alpha^{12}\alpha^0\alpha^3\alpha^6\alpha^9\alpha^{12}\alpha^0\alpha^3\alpha^6\alpha^9\alpha^{12} \end{bmatrix}$$

$$= \begin{bmatrix} 100010011010111 \\ 010011010111100 \\ 001001101011110 \\ 000100110101111 \\ 100011000110001 \\ 000110001100011 \\ 001010010100101 \\ 011110111101111 \end{bmatrix}$$

The apparatus for decoding BCH code according to the prior art can not alter error correction capability of error correction code.

To solve this problem, it is proposed in the case of transmitting digital data that an error correction code of high redundancy is employed when a condition of transmission line is not good; and an error correction code of low redundancy is employed when a condition of transmission line is good. Thus, when the redundancy of error correction code is low, the remaining portion of the error correction code is used to transmit other digital data.

Depending on the kinds of information to be transmitted, it is requested either to increase error correction capability or to increase error detection capability even if the error correction capability is low. For example, when data for a computer is transmitted, error correction capability has to be increased because data for the computer needs accuracy. When digital audio data is transmitted, error detection capability has to be increased in order to compensate for data by interpolation of the preceding and succeeding data.

If redundancy or capability of BCH code is changed, a plurality of decoding apparatus must be provided because the prior-art decoding apparatus of FIG. 1 decodes only one kind of BC code. This provides a large-scaled arrangement of the apparatus.

OBJECTS AND SUMMARY OF THE INVENTION

Accordingly, it is an object of the present invention to provide an improved apparatus for decoding BCH code in which the above defects encountered with the prior art can be eliminated.

More specifically, it is another object of the present invention to provide an apparatus for decoding BCH code in which an error correction capability and an error detection capability of BCH code for digital data to be transmitted can be changed by switching change-over switches.

It is still another object of the present invention to provide an apparatus for decoding BCH code in which a plurality of BCH codes can be decoded by a single decoding apparatus.

According to an aspect of the present invention, there is provided an apparatus for decoding BCH code comprising:

(a) first, second and third means for generating a syndrome S1, a syndrome S3 and a parity P, respectively from a receiving sequence;

(b) fourth means coupled to said first means for generating $S1^2$ from the syndrome S1;

(c) fifth means coupled to said first means, second means and fourth means for generating $(S1^3+S3)$;

(d) Chien search means including first generating means supplied with said S1 and $S1^2$ for generating a first stage of error-location polynomial A, wherein $A = S1\alpha^{-2n} + S1^2\alpha^{-n}$, and second generating means supplied with said $(S1^3+S3)$ and said A for generating a second stage of error-location polynomial B, wherein $B = A + S1^3 + S3$; and (e) error correction logic means supplied with said S1, P, $(S1^3+S3)$, A and B together with a decode selection signal and a BCH code selection signal for generating an error correction signal.

These and other objects, features and advantages of the present invention will be apparent in the following detailed description of a preferred embodiment when read in conjunction with the accompanying drawings, in which like reference numerals are used to identify the same or similar parts in the several views.

DETAILED DESCRIPTION OF A PREFERRED EMBODIMENT

An apparatus for decoding BCH code according to an embodiment of the present invention will hereinafter be described with reference to FIGS. 2 and 3.

Figure 1:
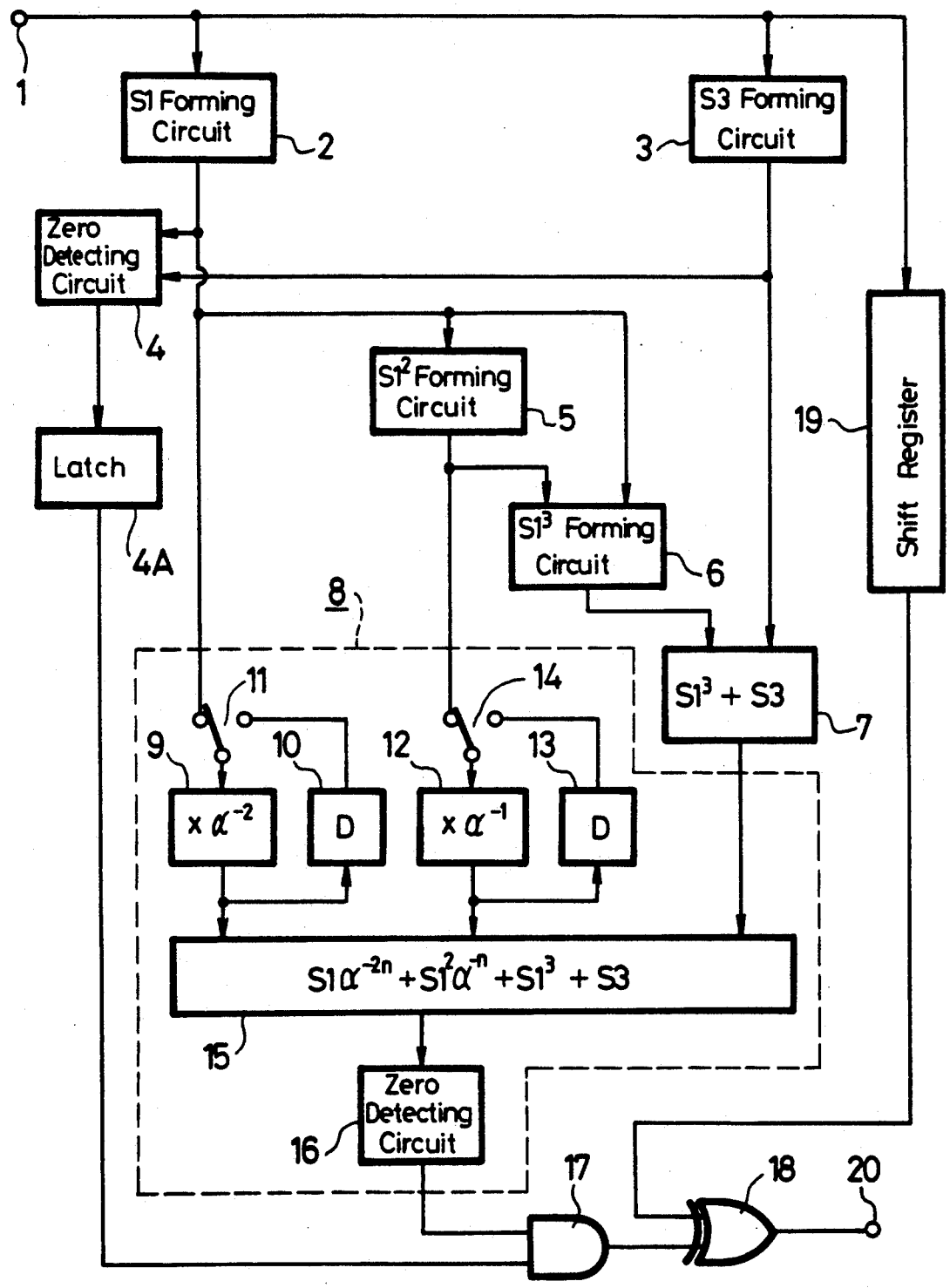
FIG. 1 is a functional block diagram showing an example of an apparatus for decoding BCH code according to the prior art.
Figure 2:
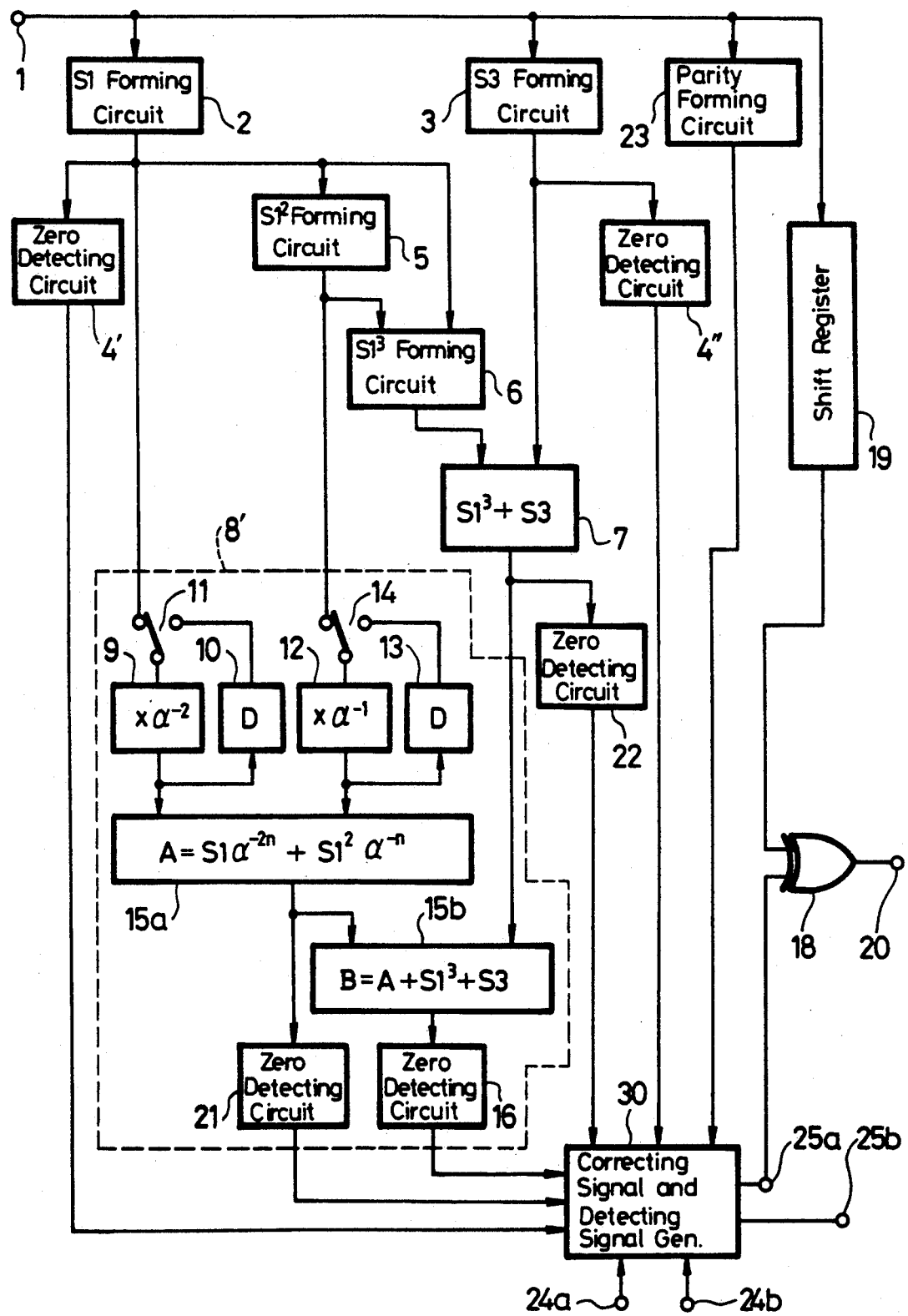
FIG. 2 is a functional block diagram showing an apparatus for decoding BCH code according to an embodiment of the present invention.

FIG. 2 shows an overall or general arrangement of an apparatus for decoding BCH code according to an embodiment of the present invention. In FIG. 2, like parts corresponding to those of FIG. 1 are marked with the same references and therefore need not be described in detail.

In the decoding apparatus of this embodiment, a Chien search circuit 8' is constructed as shown in FIG. 2. More specifically, in the Chien search circuit 8' of this embodiment, the adding circuit is divided into two adding circuits 15a and 15b. The adding circuit 15a adds the output of the arithmetic operating circuit 9 and the output of the arithmetic operating circuit 12 and forms $(A = S1\alpha^{-n} + S1^2\alpha^{-n})$. The adding circuit 15b adds the output of the adding circuit 15a and the output of the arithmetic operating adding circuit 15b is supplied to the zero detecting circuit 16. The correction instructing signal which the zero detecting circuit 16 produces as a high level signal when detecting $(A+S1^3+S3=0)$ is supplied to a correcting signal and detecting signal generating circuit 30.

The signal resulting from operation from the adding circuit 15a is supplied to a zero detecting circuit 21. A correction instructing signal which the zero detecting circuit 21 generates as a high level signal when detecting $(S1\alpha^{-2n} + S1^2\alpha^{-n} = 0)$ is supplied to the correcting signal and detecting signal generating circuit 30.

The syndrome S1 from the S1 forming circuit 2 is supplied to a zero detecting circuit 4' which generates, when the syndrome S1 is "0", a detecting signal as a low level signal. This detecting signal is supplied to the correcting signal and detecting signal generating circuit 30. The syndrome S3 from the S3 forming circuit 3 is supplied to a zero detecting circuit 4″ which generates, when detecting that the syndrome S3 is "0", a detecting signal as a low level signal. This detecting signal is supplied to the correcting signal and detecting signal generating circuit 30.

The receiving sequence applied to the input terminal 1 is supplied to a parity forming circuit 23, and a parity detecting signal from the parity forming circuit 23 is supplied to the correcting signal and detecting signal generating circuit 30.

Figure 3:
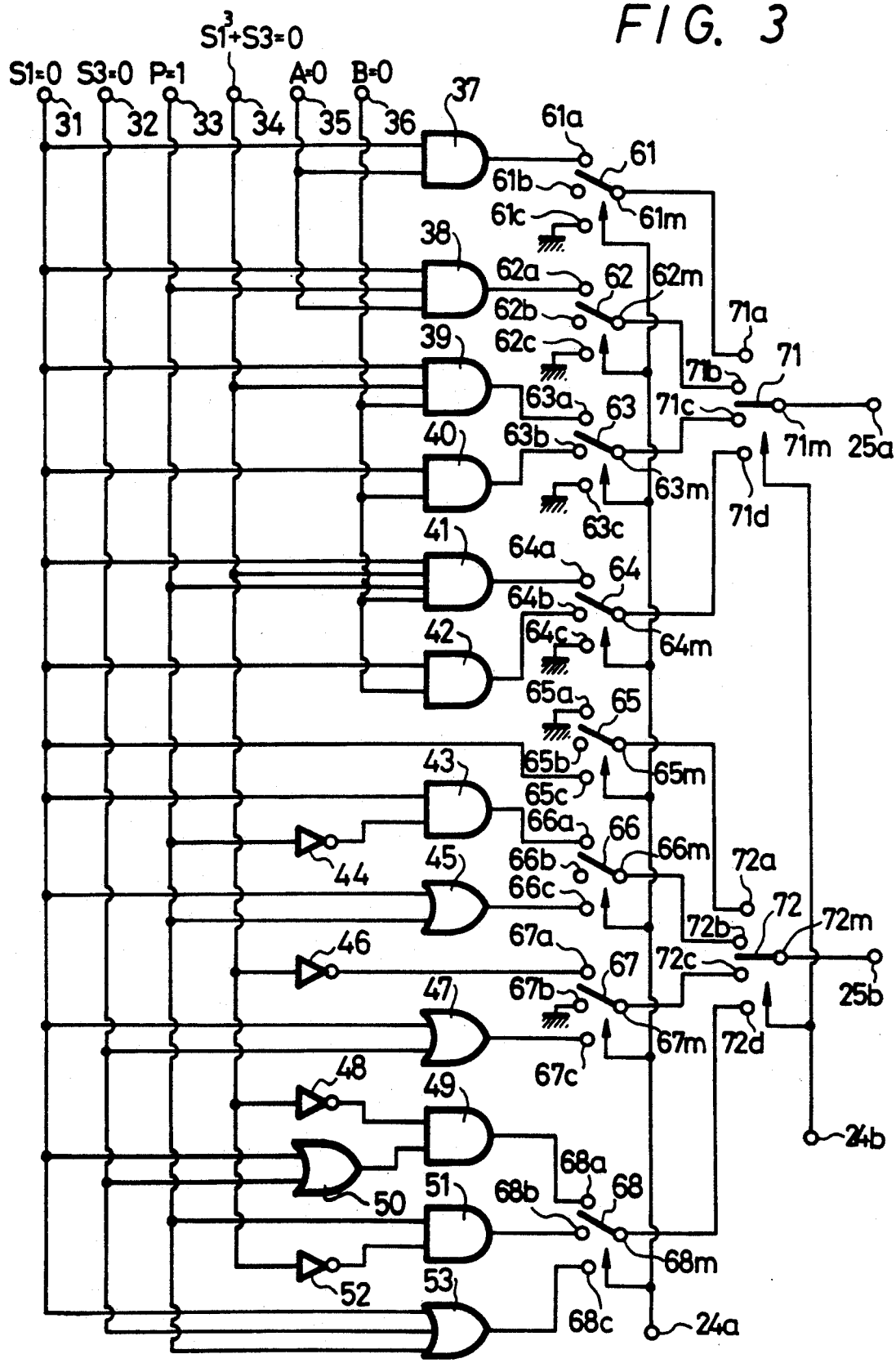
FIG. 3 is a block diagram of a circuit to generate an error correcting signal and an error detecting signal used in the apparatus of FIG. 2.

The correcting signal and detecting signal generating circuit 30 is constructed as shown in FIG. 3.

As shown in FIG. 3, input terminals 31, 32, 33, 34, 35 and 36 are supplied with the detecting signals from the zero detecting circuit 4′, the zero detecting circuit 4″, the parity forming circuit 23, the zero detecting circuit 21 and the zero detecting circuit 16, respectively.

The input terminals 31 to 36 are connected to gate circuits, each forming a generating circuit. More specifically, the zero detecting signal of syndrome S1 at the input terminal 31 is supplied to one input terminal of a 2-input AND gate 37 which forms a one-bit error correcting signal generating circuit for (15, 11) BCH code in which the minimum distance is 3. The zero detecting signal for the added signal A from the adding circuit 15a and which is applied to the terminal 35 is supplied to the other input terminal of the AND gate 37. A logical product output from the AND gate 37 is supplied to a first fixed contact 61a of a first decoding change-over switch 61.

The zero detecting signal of the syndrome S1 obtained at the terminal 31 is supplied to a first input terminal of 3-input AND circuit 38 forming a one-bit error correcting signal generating circuit for (15, 10) BCH code in which the minimum distance is 4. The parity detecting signal P obtained at the terminal 33 is supplied to a second input terminal of the AND gate 38. The zero detecting signal of the added signal A obtained at the terminal 35 is supplied to a third input terminal of the AND gate 38. The logical product output of the AND gate 38 is supplied to a first fixed contact 62a of a second decoding change-over switch 62.

The zero detecting signal for the syndrome S1 obtained at the input terminal 31 is supplied to a first input terminal of a 3-input AND gate 39 forming a one-bit error correcting signal generating circuit for (15, 7) BCH code in which the minimum distance is 5. The zero detecting signal from the zero detecting circuit 22 for $(S1^3+S3)$ obtained at the input terminal 34 is supplied to a second input terminal of the AND gate 39. The zero detecting signal of the added signal B from the adding circuit 15b and developed at the input terminal 36 is supplied to a third input terminal of the AND gate 39. Then, the logical product output from the AND gate 39 is supplied to a first fixed contact 63a of a third decoding change-over switch 63.

The zero detecting signal for the syndrome S1 obtained at the input terminal 31 is supplied to one input terminal of a 2-input AND gate 40 forming a two-bit error correcting signal generating circuit for (15, 7) BCH code in which the minimum distance is 5. The zero detecting signal of the added signal B derived from the adding circuit 15b and obtained at the input terminal 36 is supplied to the other input terminal of the AND gate 40. Then, a logical product output from the AND gate 40 is supplied to a second fixed contact 63b of a third decoding change-over switch 63.

The zero detecting signal of the syndrome S1 obtained at the input terminal 31 is supplied to a first input terminal of a 4-input AND gate 41 forming a one-bit error correcting signal generating circuit for (15, 6) BCH code in which the minimum distance is 6. The zero detecting signal for the zero detecting circuit 22 for $(S1^3+S3)$ and obtained at the input terminal 34 is supplied to a second input terminal of the AND gate 41. The parity detecting signal P obtained at the input terminal 33 is supplied to a third input terminal of the AND gate 41. The zero detecting signal for the added signal B derived from the adding circuit 15b and obtained at the input terminal 36 is supplied to a fourth input terminal of the AND gate 41. Then, a logical product output from the AND circuit 41 is supplied to a first fixed contact 64a of a fourth decoding change-over switch 64.

The zero detecting signal for the syndrome S1 and obtained at the input terminal 31 is supplied to one input terminal of a 2-input AND gate 42 forming a two-bit error correcting signal generating circuit for (15, 6) BCH code in which the minimum distance is 6. The zero detecting signal for the added signal B derived from the adding circuit 15b and derived from the input terminal 36 is supplied to the other input terminal of the AND gate 42. Then, a logical product output from the AND gate 42 is supplied to a second fixed contact 64b of the fourth decoding change-over switch 64.

The correcting signal generating circuit has been explained above, and the detecting signal generating circuit will be explained next.

The zero detecting signal for the syndrome S1 obtained at the input terminal 31 is directly supplied to a third fixed contact 65c of a fifth decoding change-over switch 65.

The zero detecting signal for the syndrome S1 obtained at the terminal 31 is supplied to one input terminal of a 2-input AND gate 43 forming a 2-bit error detecting signal generating circuit for (15, 10) BCH code in which the minimum distance is 4. The parity detecting signal P obtained at the input terminal 33 is supplied to the other input terminal of the AND gate 43 through an inverter gate 44. Then, a logical product output of the AND gate 43 is supplied to a first fixed contact 66a of a sixth decoding change-over switch 66.

The zero detecting signal for the syndrome S1 obtained at the input terminal 31 is supplied to one input terminal of a 2-input OR gate 45 forming a 3-bit error detecting signal generating circuit for (15, 10) BCH code in which the minimum distance is 4. The parity detecting signal P obtained at the input terminal 33 is supplied to the other input terminal of the OR gate 45. The logical sum output from the OR gate circuit 45 is supplied to a third fixed contact 66c of the sixth decoding change-over switch 66.

The zero detecting signal derived from the zero detecting circuit 22 for $(S1^3+S3)$ and obtained at the input terminal 34 is supplied to a first fixed contact 67a of a seventh decoding change-over switch 67 through an inverter gate 46 forming a 2- and 3-bit error detecting signal generating circuit for (15, 7) BCH code in which the minimum distance is 5.

The zero detecting signal for the syndrome S1 obtained at the input terminal 31 is supplied to a one input terminal of a 2-input OR gate 47 forming a 4-bit error detecting ) signal generating circuit for (15, 7) BCH code in which the minimum distance is 4. The zero detecting signal for the syndrome S3 obtained at the terminal 32 is supplied to the other input terminal of the OR gate 47. The logical sum output of the OR gate 47 is supplied to a third fixed contact 67c of the seventh decoding change-over switch 67.

The zero detecting signal derived from the zero detecting circuit 22 for the (S1³+S3) and obtained at the terminal 34 is supplied through an inverter gate 48 to one input terminal of a 2-input AND gate 49 forming a 2-, 3-and 4-bit error detecting signal generating circuit for (15, 6) BCH code in which the minimum distance is 6. The zero detecting signals for the syndromes S1 and S3 obtained at the input terminals 31 and 32 are supplied to one input terminal and the other input terminal of a 2-input OR gate 50. The logical sum output of the OR gate 50 is supplied to the other input terminal of the AND gate 49. The logical product output of this AND gate 49 is supplied to a first fixed contact 68a of a eighth decoding change-over switch 68.

The parity detecting signal P obtained at the terminal 33 is supplied to one input terminal of a 2-input AND gate 51 forming a 3-bit error detecting signal generating circuit for (15, 6) BCH code in which the minimum distance is 6. The zero detecting signal derived from the zero detecting circuit 22 for (S1³+S3) and obtained at the input terminal 34 is supplied to the other input terminal of the AND gate 51 through an inverter gate 52. The logical product output of the AND gate 51 is supplied to a second fixed contact 68b of the eighth decoding change-over switch 68.

The zero detecting signal for the syndrome S1 obtained at the input terminal 31 is supplied to a first input terminal of a 3-input OR gate 53 forming a 5-bit error detecting signal generating circuit for (15, 6) BCH code in which the minimum distance is 6. The zero detecting signal for the syndrome S3 obtained at the input terminal 32 is supplied to a second input terminal of the OR gate 53, and the parity detecting signal P obtained at the terminal 33 is supplied to a third input terminal of the OR gate 53. A logical sum output from the OR gate 53 is supplied to a third fixed contact 68c of the eighth decoding change-over switch 68.

The correcting signal and detecting signal generating circuit 30 according to this embodiment is supplied with a decoding switching signal from a decoding switching signal input terminal 24a, and switching of the respective decoding change-over switches 61 to 68 is controlled by the decoding switching signal.

More specifically, when a signal instructing one-bit correction is supplied to the input terminal 24a, the decoding change-over switches 61 to 68 connect their movable contacts 61m to 68m to their first fixed contacts 61a to 68a, respectively. When a signal instructing a two-bit correction is supplied to the input terminal 24a, the decoding change-over switches 61 to 68 connect their movable contacts 61m to 68m to their second fixed contacts 61b to 68b, respectively. Further, when an error detection instructing signal is supplied to the input terminal 24a, the decoding change-over switches 61 to 68 connect their movable contacts 61m to 68m to their third fixed contacts 61c to 68c, respectively.

Signals developed at the movable contacts 61m, 62m, 63m and 64m of the first, second, third and fourth decoding change-over switches 61, 62, 63 and 64 are supplied to first, second, third and fourth fixed contacts 71a, 71b, 71c and 71d of a first BCH change-over switch 71, and a signal developed at a movable contact 71m of the change-over switch 71 is supplied to a correcting signal output terminal 25a.

Signals developed at movable contacts 65m, 66m, 67m and 68m of fifth, sixth, seventh and eighth decoding change-over switches 65, 66, 67 and 68 are supplied to first, second, third and fourth fixed contacts 72a, 72b, 72c and 72d of a second BCH change-over switch 72, and a signal developed at a movable contact 72m of the change-over switch 72 is supplied to a detecting signal output terminal 25b. In this case the switching of the first and second BCH change-over switches 71 and 72 is controlled by a BCH switching signal which is supplied to the correcting signal and detecting signal generating circuit 30 from a BCH switching signal input terminal 24b. More specifically, when a signal instructing (15, 11) BCH switching signal is supplied to the terminal 24b, the BCH change-over switches 71 and 72 connect their movable contacts 71m and 72m to their first fixed contacts 71a and 72a, respectively. Similarly, when a signal instructing (15, 10) BCH code is supplied to the terminal 24b, the BCH change-over switches 71 and 72 connect their movable contacts 71m and 72m to their second fixed contacts 71b and 72b, respectively. When a signal instructing (15, 7) BCH code is supplied to the terminal 24b, the BCH change-over switches 71 and 72 connect their movable contacts 71m and 72m to their third fixed contacts 71c and 72c, respectively. When a signal instructing (15, 6) BCH code is supplied to the terminal 24b, the BCH change-over switches 71 and 72 connect their movable contacts 71m and 72m to their fourth fixed contacts 71d and 72d, respectively.

Referring back to FIG. 2, the error correcting signal obtained at the correcting signal output terminal 25a of the correcting signal and detecting signal generating circuit 30 in this embodiment is supplied to one input terminal of the 2-input EX-OR gate 18, and the output signal from shift register 19 is supplied to the other input terminal of the EX-OR gate 18. The output signal from the EX-OR gate 18 is supplied to the output terminal 20, and data sequence thus error-corrected is derived from the output terminal 20. Other components of the decoding apparatus in this embodiment are formed similarly to those of the prior-art decoding apparatus of FIG. 1.

BCH code, decoded by the decoding apparatus of the invention, will be explained hereinbelow.

The apparatus for decoding BCH code according to this embodiment can decode all BCH codes in which the minimum distance is 3 to 6, and, in which the elements over the Galois field which is given by $(x^4+x+1)$. A generator polynomial of each code will be explained below.

The (15, 11) BCH code has the minimum distance of 3 and can correct an error of one bit or detect errors of up to two bits. The generator polynomial of this code is $$G_1(X) = x^4 + x + 1$$

The (15, 10) BCH code, resulting from expanding (15, 11) BCH code, has a minimum distance of 4. Therefore, the (15, 10) BCH code can correct a one bit error and detect the errors up to 2 bits or detect errors up to 3 bits. The generator polynomial of this code is $$\begin{aligned}G_2(X) &= (x^4 + x + 1)(x + 1) \\ &= x^5 + x^4 + x^2 + x\end{aligned}$$

The (15, 7) BCH code has a minimum distance of 5 and can correct errors up to 2 bits, or correct an error of one bit and detect errors up to 3 bits or, alternatively, detect errors up to 4 bits. The generator polynomial of this code is $$G_3(X) = (x^4 + x + 1)(x^4 + x^3 + x^2 + x + 1)$$
$$= x^8 + x^7 + x^6 + x^4 + 1$$

The (15, 6) BCH code, resulting from expanding the (15, 7) BCH code, has a minimum distance of 6, and therefore, errors up to 2 bits can be corrected and errors up to 3 bits and can be detected or an error of one bit can be corrected and errors up to 4 bits can be detected. Alternatively, errors up to 5 bits can be detected. The generator polynomial of this code is $$G_4(X) = (x^4 + x + 1)(x^4 + x^3 + x^2 + x + 1)(x + 1)$$
$$= x^9 + x^6 + x^5 + x^4 + x + 1$$

The following table 1 show conditions of the respective detecting signals which are supplied to the above correcting signal and detecting signal generating circuit 30 on the basis of the number of errors in the application of BCH codes.

TABLE 1

| BCH Codes | Number of errors | S1 | S3 | $S1^3 + S3$ | P |
|---|---|---|---|---|---|
| (15, 11) BCH | 0 | 0 | | | |
| code: minimum | 1 | $\neq 0$ | | | |
| distance is 3 | 2 | $\neq 0$ | | | |
| (15, 10) BCH | 0 | 0 | | | 0 |
| code: minimum | 1 | $\neq 0$ | | | 1 |
| distance is 4 | 2 | $\neq 0$ | 0 | | |
| | 3 | not determined | | | 1 |
| (15, 7) BCH | 0 | 0 | 0 | 0 | |
| code: minimum | 1 | $\neq 0$ | $\neq 0$ | 0 | |
| distance is 5 | 2 | $\neq 0$ | not determined | $\neq 0$ | |
| | 3 | not determined | $\neq 0$ | $\neq 0$ | |
| | 4 | not determined | not determined | not determined | |
| (15, 6) BCH | 0 | 0 | 0 | 0 | 0 |
| code: minimum | 1 | $\neq 0$ | $\neq 0$ | 0 | 1 |
| distance is 6 | 2 | $\neq 0$ | not determined | $\neq 0$ | 0 |
| | 3 | not determined | $\neq 0$ | $\neq 0$ | 1 |
| | 4 | not determined | not determined | not determined | 0 |
| | 5 | not determined | not determined | not determined | 1 |

When the number of errors of the (15, 7) BCH code is four and the number of errors of the (15, 6) BCH code is four, indicating by in Table 1, the syndromes S1 and S3 do not become zero simultaneously.

The signal generating circuit and detecting signal generating circuit for the respective codes shown in FIG. 3 are constructed on the basis of the condition shown in Table 1. The switching signal for instructing one of the operations that the error of one bit is corrected, the errors of 2 bits are corrected and that the error is only detected is supplied to the terminal 24a and the switching signal instructing which one of the BCH codes is decoded is supplied to the terminal 24b, whereby all the decodings shown in Table 1 become possible. Therefore, the error correcting capability and the error detecting capability of BCH code of digital data to be transmitted can be changed by only switching the switches, and optimum BCH code can be selected on the basis of condition of transmission line, the kinds of transmission data and so on, which provides efficient data transmission. Further, in this embodiment, the circuit scale of the decoding apparatus is substantially the same as that of the prior-art decoding apparatus of FIG. 1, and is simple so that it can be formed as an LSI.

Furthermore, the decoding apparatus of this embodiment can be applied to various decoding methods, such as the methods referred to above which involve selective increases in error correction capability or error detection capability and therefore, this decoding apparatus of the invention can be commonly applied to various transmitting apparatus. Thus, the decoder can be used for various purposes.

Having described a preferred embodiment in detail with reference to the accompanying drawings, it is to be understood that the present invention is not limited to that precise embodiment and that many changes and modifications could be effected by one skilled in the art without departing from the spirit and scope of the invention as defined in the appended claims.

I claim as my invention:

1. An apparatus for decoding BCH code comprising:
   (a) first, second and third means for generating a syndrome S1, a syndrome S3 and a parity P, respectively from a received sequence;
   (b) fourth means coupled to said first means for generating $S1^2$ from the syndrome S1;
   (c) fifth means coupled to said first means, second means and fourth means for generating $(S1^3 + S3)$;
   (d) Chien search means including first generating means supplied with said S1 and $S1^2$ for generating a first stage of error-location polynomial A, where $A + S1\alpha^{-2n} + S1^2\alpha^{-n}$, and second generating means supplied with said $(S1^3 + S3)$ and said A for generating a second stage of error-location polynomial B, wherein $B = A + S1^3 + S3$; and
   (e) error correction logic means supplied with said S1, P, $(S1^3 + S3)$, A and B together with a decode selection signal and a BCH code selection signal for generating an error correction signal.

2. An apparatus for decoding BCH code as cited in claim 1, further comprising error detection logic means supplied with said S1, S3, P and $(S1^3 + S3)$ together with a decode selection signal and a BCH code selection signal for generating an error detection signal.

3. An apparatus for decoding a BCH code as cited in claim 1, wherein each of said S1, $(S1^3 + S3)$, A and B are respectively supplied to said error correction logic means through individual zero detecting means.

4. An apparatus for decoding BCH code as cited in claim 2, wherein said S1, S3 and $(S1^3 + S3)$ are respectively supplied to said error detection logic means through zero detecting means.

5. An apparatus for decoding BCH code as cited in claim 1, further comprising shift register means interposed in a signal path of said received sequence, and correction gate means supplied with said output of said shift register means and said errors correction signal for correcting error included in said received sequence.

* * * * *